(12) United States Patent
Lin et al.

(10) Patent No.: US 10,618,245 B2
(45) Date of Patent: Apr. 14, 2020

(54) FLEXIBLE LAMINATED STRUCTURE AND DISPLAY

(71) Applicant: E Ink Holdings Inc., Hsinchu (TW)

(72) Inventors: Kuan-Yi Lin, Hsinchu (TW); Yu-Wen Chen, Hsinchu (TW); Yu-Chieh Hung, Hsinchu (TW); Chun-Yu Lu, Hsinchu (TW); Chia-Chun Yeh, Hsinchu (TW); Yi-Sheng Lin, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 113 days.

(21) Appl. No.: 16/004,440

(22) Filed: Jun. 11, 2018

(65) Prior Publication Data
US 2018/0354224 A1 Dec. 13, 2018

(30) Foreign Application Priority Data
Jun. 13, 2017 (CN) .......................... 2017 1 0441814

(51) Int. Cl.
| | |
|---|---|
| *B32B 3/02* | (2006.01) |
| *B32B 3/26* | (2006.01) |
| *B32B 15/04* | (2006.01) |
| *H01L 51/00* | (2006.01) |
| *G02F 1/167* | (2019.01) |
| *G02F 1/1333* | (2006.01) |
| *G02F 1/16755* | (2019.01) |

(52) U.S. Cl.
CPC ............ *B32B 3/266* (2013.01); *B32B 15/043* (2013.01); *B32B 2255/06* (2013.01); *B32B 2457/20* (2013.01); *B32B 2457/206* (2013.01); *G02F 1/133305* (2013.01); *G02F 1/167* (2013.01); *G02F 1/16755* (2019.01); *G02F 2201/50* (2013.01); *G02F 2202/28* (2013.01); *H01L 51/0097* (2013.01); *H01L 2251/5338* (2013.01)

(58) Field of Classification Search
CPC ... B32B 3/266; B32B 15/043; G02F 1/16755; G02F 1/133305; G02F 2201/50; G02F 2202/28; H01L 51/0097; H01L 2251/5338
See application file for complete search history.

(56) References Cited

U.S. PATENT DOCUMENTS

| | | | |
|---|---|---|---|
| 8,653,200 | B2 | 2/2014 | Takahashi et al. |
| 8,920,592 | B2 | 12/2014 | Suwa et al. |
| 9,012,028 | B2 | 4/2015 | Takahashi et al. |

(Continued)

FOREIGN PATENT DOCUMENTS

| | | |
|---|---|---|
| JP | 2007047511 | 2/2007 |
| JP | 2012252224 | 12/2012 |

(Continued)

*Primary Examiner* — Elizabeth E Mulvaney
(74) *Attorney, Agent, or Firm* — JCIPRNET

(57) ABSTRACT

A flexible laminated structure includes a first protection layer, a second protection layer directly contacting the first protection layer and a flexible material layer. The second protection layer having a plurality of openings, which are used to expose a portion of the first protection layer. The flexible material layer is disposed on the second protection layer and extends into the openings, and directly contacts the first protection layer exposed by the openings. An adhesion between the flexible material layer and the first protection layer is greater than an adhesion between the second protection layer and the first protection layer.

10 Claims, 1 Drawing Sheet

(56) References Cited

U.S. PATENT DOCUMENTS

| | | | |
|---|---|---|---|
| 9,437,832 B2 | 9/2016 | Sakuishi et al. | |
| 10,074,824 B2 * | 9/2018 | Han | G06F 1/1677 |
| 2013/0271828 A1 * | 10/2013 | Everaerts | G02B 5/20 |
| | | | 359/361 |
| 2015/0212626 A1 | 7/2015 | Kim et al. | |
| 2015/0236280 A1 | 8/2015 | Sakuishi et al. | |
| 2015/0251393 A1 | 9/2015 | Kanna et al. | |
| 2015/0299520 A1 | 10/2015 | Mansei et al. | |
| 2015/0318339 A1 | 11/2015 | Nakamura et al. | |

FOREIGN PATENT DOCUMENTS

| | | |
|---|---|---|
| TW | 201511133 | 3/2015 |
| TW | 201602855 | 1/2016 |
| TW | 201643841 | 12/2016 |

\* cited by examiner

FLEXIBLE LAMINATED STRUCTURE AND DISPLAY

CROSS-REFERENCE TO RELATED APPLICATION

This application claims the priority benefit of China application serial no. 201710441814.2, filed on Jun. 13, 2017. The entirety of the above-mentioned patent application is hereby incorporated by reference herein and made a part of this specification.

BACKGROUND OF THE INVENTION

Field of the Invention

The invention relates to a laminated structure and a display, and particularly to a flexible laminated structure and a display comprising the flexible laminated structure.

Description of Related Art

Generally speaking, a conventional flexible display covers a display area of a display panel via a resin layer, and directly contacts a pressure sensitive adhesive layer disposed thereon. However, due to the difference in materials properties of the pressure sensitive adhesive layer and the resin layer, the adhesion of the contact interface between the pressure sensitive adhesive layer and the resin layer is inferior. Therefore, when the flexible display is bended, a peeling effect is likely to occur on the interface between the pressure sensitive adhesive layer and the resin layer, causing the structural reliability of the flexible display panel to be decreased.

SUMMARY OF THE INVENTION

The invention provides a flexible laminated structure, and an adhesion between a flexible material layer and a first protection layer is greater than an adhesion between a second protection layer and the first protection layer, thereby reducing a peeling effect occurred in the flexible laminated structure.

The invention provides a display comprising the flexible laminated structure and has a better structural reliability.

In the invention, the flexible laminated structure comprises a first protection layer; a second protection layer which directly contacts the first protection layer; and a flexible material layer. The second protection layer has a plurality of openings, wherein the openings expose a portion of the first protection layer. The flexible material layer is disposed on the second protection layer and extends into the openings, and directly contacts the first protection layer exposed by the openings. The adhesion between the flexible material layer and the first protection layer is greater than the adhesion between the second protection layer and the first protection layer.

In one embodiment of the invention, the flexible material layer is a pressure sensitive adhesive (PSA) layer, and the flexible material layer is filled up in the opening.

In one embodiment of the invention, the flexible laminated structure further includes a patterned metal layer disposed between an upper surface of the second protection layer and the flexible material layer.

In one embodiment of the invention, the flexible material layer is a metal layer covering an upper surface of the second protection layer and an inner wall of the opening, and including a plurality of contact openings exposing a portion of the upper surface of the second protection layer.

In one embodiment of the invention, the flexible laminated structure further includes a pressure adhesive layer disposed on the flexible material layer and directly contacts the second protection layer via the contact opening.

The display of the invention includes a flexible display unit and a flexible laminated structure. The flexible laminated structure is disposed on the flexible display unit including a first protection layer; a second protection layer which directly contacts the first protection layer; and a flexible material layer. The second protection layer includes a plurality of openings, wherein the openings expose a portion of the first protection layer. The flexible material layer is disposed on the second protection layer and extends into the opening, and directly contacts the first protection layer exposed by the contact opening. The adhesion between the flexible material layer and the first protection layer is greater than the adhesion between the second protection layer and the first protection layer.

In one embodiment of the invention, the flexible material layer is a pressure sensitive adhesive (PSA) layer, and the flexible material layer is filled up in the opening.

In one embodiment of the invention, the flexible laminated structure further includes a patterned metal layer disposed between an upper surface of the second protection layer and the flexible material layer.

In one embodiment of the invention, the flexible material layer is a metal layer covering an upper surface of the second protection layer and an inner wall of the opening, and including a plurality of contact openings which expose a portion of the upper surface of the second protection layer.

In one embodiment of the invention, the flexible laminated structure further includes a pressure adhesive layer disposed on the flexible material layer, and directly contacts the second protection layer via the contact opening.

Based on the above, in the flexible laminated structure of the invention, since the adhesion between the flexible material layer and the first protection layer is greater than the adhesion between the second protection layer and the first protection layer, a tensile force generated by the flexible material layer on the first protection layer during bending can be dispersed to reduce occurrence of peeling effect. In addition, the display of the invention includes the flexible laminated structure and thus has a better structural strength.

In order to make the aforementioned features and advantages of the invention more comprehensible, embodiments accompanying figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF EMBODIMENTS

Figure 1:
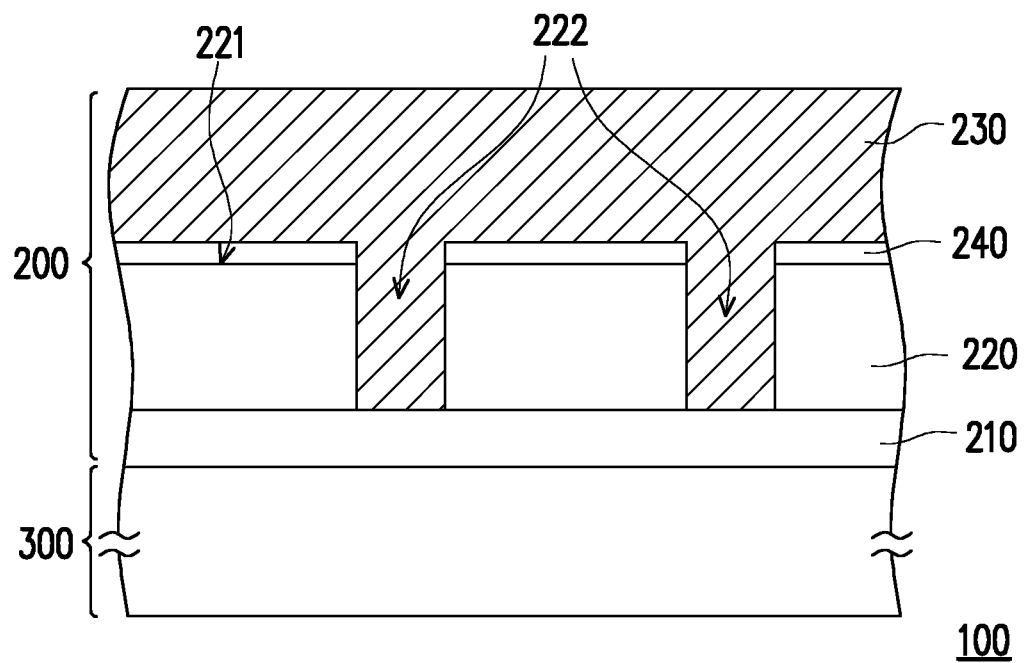
FIG. 1 is a cross-sectional view of a display according to one embodiment of the invention.

FIG. 1 is a cross-sectional view of a display according to one embodiment of the invention. Referring to FIG. 1, a display 100 of the embodiment includes a flexible laminated structure 200 and a flexible display unit 300, wherein the flexible laminated structure 200 is disposed on the flexible display unit 300. Here, the flexible display unit 300 is, for example, an electrophoretic display panel or OLED display panel, which should not be construed as a limitation to the invention.

Specifically, the flexible laminated structure 200 of the display 100 of the embodiment includes a first protection layer 210, a second protection layer 220 and a flexible material layer 230. The first protection layer 210 directly contacts the flexible display unit 300. The second protection layer 220 directly contacts the first protection layer and has a plurality of openings 222, wherein the opening 222 exposes a portion of the first protection layer 210. The flexible material layer 230 is disposed on the second protection layer 220 and extends into the opening 222, and directly contacts the first protection layer 210 exposed by the opening 222. In particular, an adhesion between the flexible material layer 230 and the first protection layer 210 is greater than an adhesion between the second protection layer 220 and the first protection layer 210 so that a tensile force generated by the flexible material layer 230 to the first protection layer 210 when the flexible display unit 300 is bended, can be dispersed, and the first protection layer 210 and the second protection layer 220 are not easily separated from each other on the interface due to bending, thereby reducing occurrence of peeling effect.

More specifically, the flexible material layer 230 of the embodiment is practically a pressure sensitive adhesive (PSA) layer which covers the second protection layer 220 and is filled up in the opening 222. Moreover, the flexible laminated structure 200 of the embodiment further includes a patterned metal layer 240, wherein the patterned metal layer 240 is disposed between an upper surface 221 of the second protection layer 220 and the flexible material layer 230. Herein, an orthogonal projection of the patterned metal layer 240 on the first protection layer 210 completely overlaps an orthogonal projection of the upper surface 221 of the second protection layer 220 on the first protection layer 210, and the patterned metal layer 240 is conformal to the second protection layer 220.

With the configuration that the second protection layer 220 of the embodiment has openings 222 that expose a portion of the first protection layer 210, when the flexible material layer 230 is filled up in the openings 222, the flexible material layer 230 can directly contact the first protection layer 210, wherein the adhesion between the flexible material layer 230 and the first protection layer 210 is greater than the adhesion between the second protection layer 220 and the first protection layer 210. Therefore, when the flexible display unit 300 is bended, the tensile force generated by the flexible material layer 230 on the first protection layer 210 can be dispersed so that the first protection layer 210 and the second protection layer 220 are not easily separated from each other on the interface due to bending, thereby reducing occurrence of peeling effect. In addition, the display 100 of the embodiment includes the flexible laminated structure 200 and thus has a better structural reliability.

Figure 2:
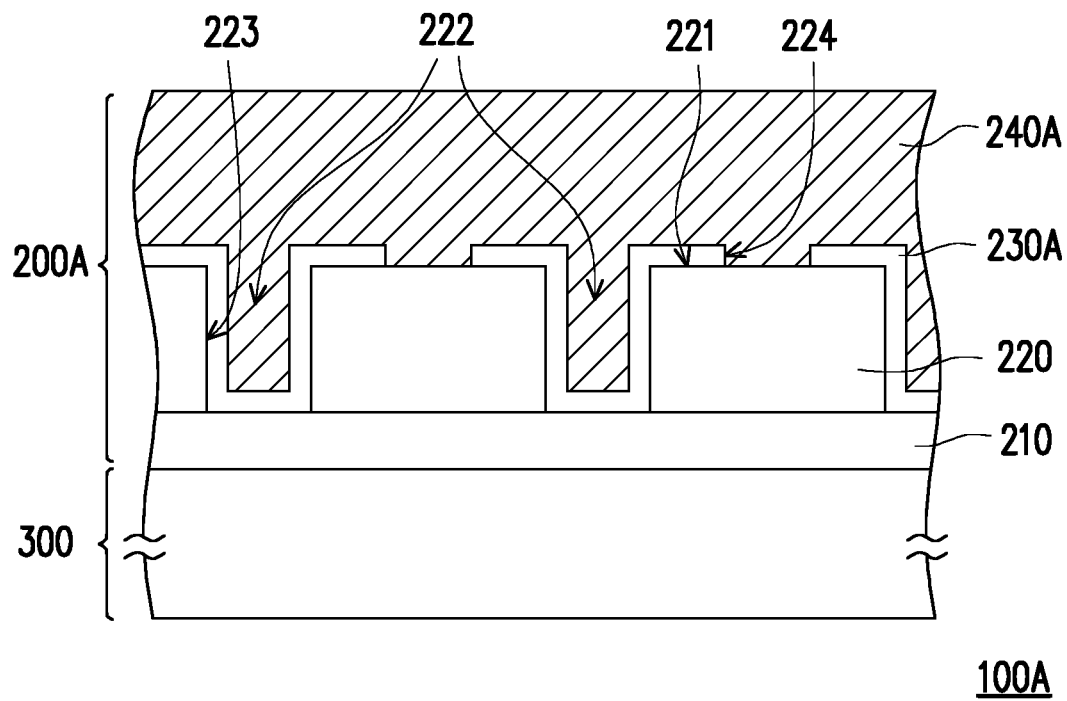
FIG. 2 is a cross-sectional view of a display according to another embodiment of the invention.

FIG. 2 is a cross-sectional view of a display according to another embodiment of the invention. Referring to both of FIGS. 1 and 2, a display 100A of the embodiment is similar to the display 100 of FIG. 1; the major difference between them lies in that a flexible material layer 230A of a flexible laminated structure 200A of the embodiment is practically a metal layer which covers an upper surface 221 of the second protection layer 220 and an inner wall 223 of the opening 222, and directly contacts the first protection layer 210 exposed by the opening 222, and including a plurality of contact openings 224 that expose a portion of the upper surface 221 of the second protection layer 220. Moreover, the flexible laminated structure 200A of the embodiment further includes a pressures adhesive layer 240A disposed on the flexible material layer 230A and directly contacts the second protection layer 220 via the contact opening 224. The pressure adhesive layer 240A is disposed on the flexible material layer 230A, covering the flexible material layer 230A, filled up in the opening 222 and directly contacts the flexible material layer 230A in the opening 222.

With the configuration that second protection layer 220 of the embodiment has the opening 222 that expose the portion of the first protection layer 210, and the flexible material layer 230A covers the upper surface 221 of the second protection layer 220 and the inner wall 223 of the opening 222 while directly contacting the first protection layer 210 exposed by the opening 222, wherein the adhesion between the flexible material layer 230A and the first protection layer 210 is greater than the adhesion between the second protection layer 220 and the first protection layer 210, when the flexible display unit 300 is bended, the tensile force generated by the flexible material layer 230A on the first protection layer 210 can be dispersed so that the first protection layer 210 and the second protection layer 220 are not easily separated from each other on the interface due to bending, thereby reducing occurrence of peeling effect. In addition, the display 100A of the embodiment includes the flexible laminated structure 200A and thus has a better structural reliability.

It should be pointed out that the invention provides no limitation to the structural form of the flexible laminated structures 200 and 200A. As long as the adhesion between the flexible material layers 230 and 230A and the first protection layer 210 is greater than the adhesion between the second protection layer 220 and the first protection layer 210, they all fall within the scope to be protected by the invention.

In summary of the above, in the flexible laminated structure of the invention, since the adhesion between the flexible material layer and the first protection layer is greater than the adhesion between the second protection layer and the first protection layer, the tensile force generated by the flexible material layer on the first protection layer during bending can be dispersed so as to reduce generation of peeling effect. In addition, the display of the invention includes the flexible laminated structure and thus has a better structural strength.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:
1. A flexible laminated structure, comprising:
a first protection layer;
a second protection layer, directly contacting the first protection layer and comprising a plurality of openings, wherein the openings expose a portion of the first protection layer; and
a flexible material layer, disposed on the second protection layer, extending into the openings and directly contacting the first protection layer exposed by the openings, wherein an adhesion between the flexible material layer and the first protection layer is greater than an adhesion between the second protection layer and the first protection layer.

2. The flexible laminated structure as recited in claim 1, wherein the flexible material layer is a pressure sensitive adhesive layer, and the flexible material layer is filled up in the openings.

3. The flexible laminated structure as recited in claim 1, further comprising:

a patterned metal layer, disposed between an upper surface of the second protection layer and the flexible material layer.

4. The flexible laminated structure as recited in claim 1, wherein the flexible material layer is a metal layer covering an upper surface of the second protection layer and an inner wall of the openings, and comprising a plurality of contact openings exposing a portion of the upper surface of the second protection layer.

5. The flexible laminated structure as recited in claim 4, further comprising:

a pressure adhesive layer, disposed on the flexible material layer, and directly contacting the second protection layer via the contact openings.

6. A display, comprising:

a flexible display unit; and a flexible laminated structure, disposed on the flexible display unit, the flexible laminated structure comprising:

a first protection layer;

a second protection layer, directly contacting the first protection layer and comprising a plurality of openings, wherein the openings expose a portion of the first protection layer; and a flexible material layer, disposed on the second protection layer, and extending into the openings, and directly contacting the first protection layer exposed by the openings, wherein an adhesion between the flexible material layer and the first protection layer is greater than an adhesion between the second protection layer and the first protection layer.

7. The display as recited in claim 6, wherein the flexible material layer is a pressure sensitive adhesive layer, and the flexible material layer is filled up in the openings.

8. The display as recited in claim 6, wherein the flexible laminated structure further comprises:

a patterned metal layer, disposed between an upper surface of the second protection layer and the flexible material layer.

9. The display as recited in claim 6, wherein the flexible material layer is a metal layer covering an upper surface of the second protection layer and an inner wall of the openings, and comprising a plurality of contact openings exposing a portion of the upper surface of the second protection layer.

10. The display as recited in claim 9, wherein the flexible laminated structure further comprises:

a pressure adhesive layer, disposed on the flexible material layer, and directly contacting the second protection layer via the contact openings.

* * * * *